United States Patent [19]
De Loe, Jr. et al.

[11] Patent Number: 5,893,030
[45] Date of Patent: *Apr. 6, 1999

[54] DUAL-FUNCTION DOUBLE BALANCED MIXER CIRCUIT

[75] Inventors: John P. De Loe, Jr., Decatur, Ga.; He Feng Wang, Saitama, Japan

[73] Assignee: Oki Telecom

[ * ] Notice: The term of this patent shall not extend beyond the expiration date of Pat. No. 5,649,288.

[21] Appl. No.: 249,261

[22] Filed: May 25, 1994

[51] Int. Cl.⁶ .................................................. H04B 1/26
[52] U.S. Cl. ........................ 455/326; 455/422; 455/42; 455/205; 455/209
[58] Field of Search ..................................... 455/326, 333, 455/313, 315, 316, 318, 323, 330, 33.1, 42, 93, 142, 205, 209, 84–86, 89, 338, 260; 375/205, 295, 216; 332/127, 136; 327/355

[56] References Cited

U.S. PATENT DOCUMENTS

| | | | |
|---|---|---|---|
| Re. 31,643 | 8/1984 | Waldman | 179/81 R |
| 3,696,302 | 10/1972 | Gossard | 325/432 |
| 4,468,784 | 8/1984 | Jagnow et al. | 375/1 |
| 4,630,008 | 12/1986 | Weeks | 332/167 |
| 4,636,736 | 1/1987 | Woodworth et al. | 329/50 |
| 4,688,263 | 8/1987 | Aldridge | 455/142 |
| 4,726,072 | 2/1988 | Yamashita | 455/189 |
| 4,864,644 | 9/1989 | Takahashi et al. | 455/330 |
| 5,020,092 | 5/1991 | Phillips | 455/552 |
| 5,034,994 | 7/1991 | Muterspaugh | 455/326 |
| 5,060,298 | 10/1991 | Waugh et al. | 455/326 |
| 5,140,705 | 8/1992 | Kosuga | 455/318 |
| 5,157,786 | 10/1992 | Muterspaugh | 455/326 |
| 5,170,500 | 12/1992 | Broderick | 455/315 |
| 5,259,007 | 11/1993 | Yamamoto | 375/120 |
| 5,272,721 | 12/1993 | Mikoshiba et al. | 375/1 |
| 5,307,518 | 4/1994 | Maeda et al. | 455/330 |
| 5,423,076 | 6/1995 | Westergren | 455/86 |
| 5,428,839 | 6/1995 | Friesen et al. | 455/326 |
| 5,448,772 | 9/1995 | Grandfield | 455/326 |
| 5,457,734 | 10/1995 | Eryaman | 455/422 |

Primary Examiner—William A. Cuchlinski, Jr.
Assistant Examiner—Gertrude Arthur
Attorney, Agent, or Firm—Thomas, Kayden, Horstemeyer & Risley, L.L.P.

[57] ABSTRACT

A circuit for connecting multiple signal paths within a multi-mode communication device includes a double balanced mixer circuit selectively functioning as a modulation switch during an unbalanced state. As applied to a transmit section of a CDMA/FM cellular telephone, a dual-function double balanced mixer circuit connects a CDMA IF signal path with an FM audio signal path. The double balanced mixer circuit includes a double balanced mixer connected through oscillator input to an external LC (inductor-capacitor) tank connected to both a PLL (phase lock loop) and an FM audio signal. One signal input of the double balanced mixer receives a CDMA low IF signal, while the other double balanced mixer signal input is connected to a microprocessor-controlled switch for selectively unbalancing the balanced mixer while in the FM mode of operation.

41 Claims, 6 Drawing Sheets

DUAL-FUNCTION DOUBLE BALANCED MIXER CIRCUIT

BACKGROUND OF THE INVENTION

The present invention relates generally to the field of frequency modification, and more specifically, to the field of multi-mode cellular telephone frequency conversion and modulation.

Multi-mode communication devices are capable of operating in two or more different modes for use in two or more different types of communication systems. Among various types of radios and radio communication devices, one type of multi-mode communication device is a dual-mode cellular telephone capable of operating in both analog FM (frequency modulation) systems and digital CDMA (code division multiple access) systems.

CDMA/FM cellular telephones and other communication devices typically include circuitry defining multiple signal paths for processing signals according to the multiple modes supported by the device. Normally, the various signal paths connect at some controlled switched point. It has been found that typical schemes for connecting the signal paths and switching between the various modes of communication can be improved. In one prior CDMA/FM cellular telephone scheme, the CDMA transmit signal path includes a CDMA IF (intermediate frequency) mixer section for up-converting a low frequency IF CDMA transmit signal into a higher frequency IF CDMA transmit signal. A separate FM transmit signal path includes an FM modulation section for modulating an intermediate carrier frequency with an FM audio signal to produce an FM IF signal. Subsequent to the FM modulation section and the CDMA IF mixer section, the two signal paths join each other in an adjustable amplifier section. Unfortunately, by keeping the signal paths separate until the IF stage, this connection scheme requires a large number of components, resulting in a larger, more expensive communication device.

There is, therefore, a need in the industry for a scheme for connecting signal paths of multi-mode communication devices which addresses these and other related, and unrelated, problems.

SUMMARY OF THE INVENTION

Briefly described, the present invention includes, in its most preferred embodiment as applied to a transmit section of a CDMA/FM cellular telephone, a dual-function double balanced mixer circuit which provides a scheme for connecting a CDMA IF signal path with an FM audio signal path. The double balanced mixer circuit includes a double balanced mixer with an external LC (inductor-capacitor) tank connected to both a PLL (phase lock loop) and an FM audio signal. The oscillator inputs of the double balanced mixer are connected to the external LC tank. One signal input of the double balanced mixer receives a CDMA low IF signal, while the other double balanced mixer signal input is connected to a microprocessor-controlled switch for selectively unbalancing the balanced mixer while in the FM mode of operation.

During the CDMA mode of operation, the CDMA low IF line carries a signal, while the FM audio line does not carry a signal. Furthermore, the double balanced mixer functions normally to convert the CDMA low IF signal into a CDMA high IF signal which includes the frequency sum and frequency difference of the CDMA low IF signal and the oscillator signal from the external LC tank.

Thus, the double balanced mixer outputs a CDMA high IF signal which does not include either the frequency of the input CDMA low IF signal or the frequency of the oscillator inputs. In the FM mode of operation, the FM audio line, rather than the CDMA low IF line, carries a signal. Since the FM audio line is connected to the external LC tank, the oscillated signal of the external LC tank becomes a carrier signal which is modulated by the FM audio signal so that the oscillator inputs of the double balanced mixer receive an FM IF signal. In addition, in the FM mode of operation, one of the double balanced mixer signal inputs is essentially grounded to unbalance the double balanced mixer. In this way, the double balanced mixer outputs the FM IF signal.

In one preferred embodiment of the present invention, both signal outputs of the double balanced mixer are utilized, with a first output being used during the CDMA mode, and a second output being used during the FM mode. In addition, an FM bypass circuit is connected to the second output. In another preferred embodiment of the present invention, depending on the availability and quality of filters and other components within the cellular telephone, only the first output is used, and the FM bypass circuit is omitted. Alternate embodiments of the present invention include alternate applications of the connection scheme of the present invention in other types of communication devices. Furthermore, the scope of the present invention is also intended to include other circuital arrangements of mixers, such as I & Q baseband modulation and demodulation, as well as double and single side band modulation, etc.

It is therefore an object of the present invention to provide a new double balanced mixer circuit.

Another object of the present invention is to provide a scheme for connecting multiple signal paths within a multi-mode communication device.

Another object of the present invention is to provide a dual-function double balanced mixer circuit.

Yet another object of the present invention is to provide dual-function double balanced mixer circuit which, in one mode, mixes signals for frequency conversion, and, in another mode, modulates a carrier signal.

Still another object of the present invention is to provide a double balanced mixer functioning as a modulation switch.

Still another object of the present invention is to provide an adjustable oscillator circuit providing frequency modulation and providing a frequency source for frequency conversion.

Still another object of the present invention is to provide a double balanced mixer and a control circuit for substantially grounding one input of the double balanced mixer to unbalance the double balanced mixer.

Other objects, features and advantages of the present invention will become apparent upon reading and understanding the present specification, when taken in conjunction with the accompanying drawings.

DETAILED DESCRIPTION OF THE PREFERRED EMBODIMENTS

Figure 1:
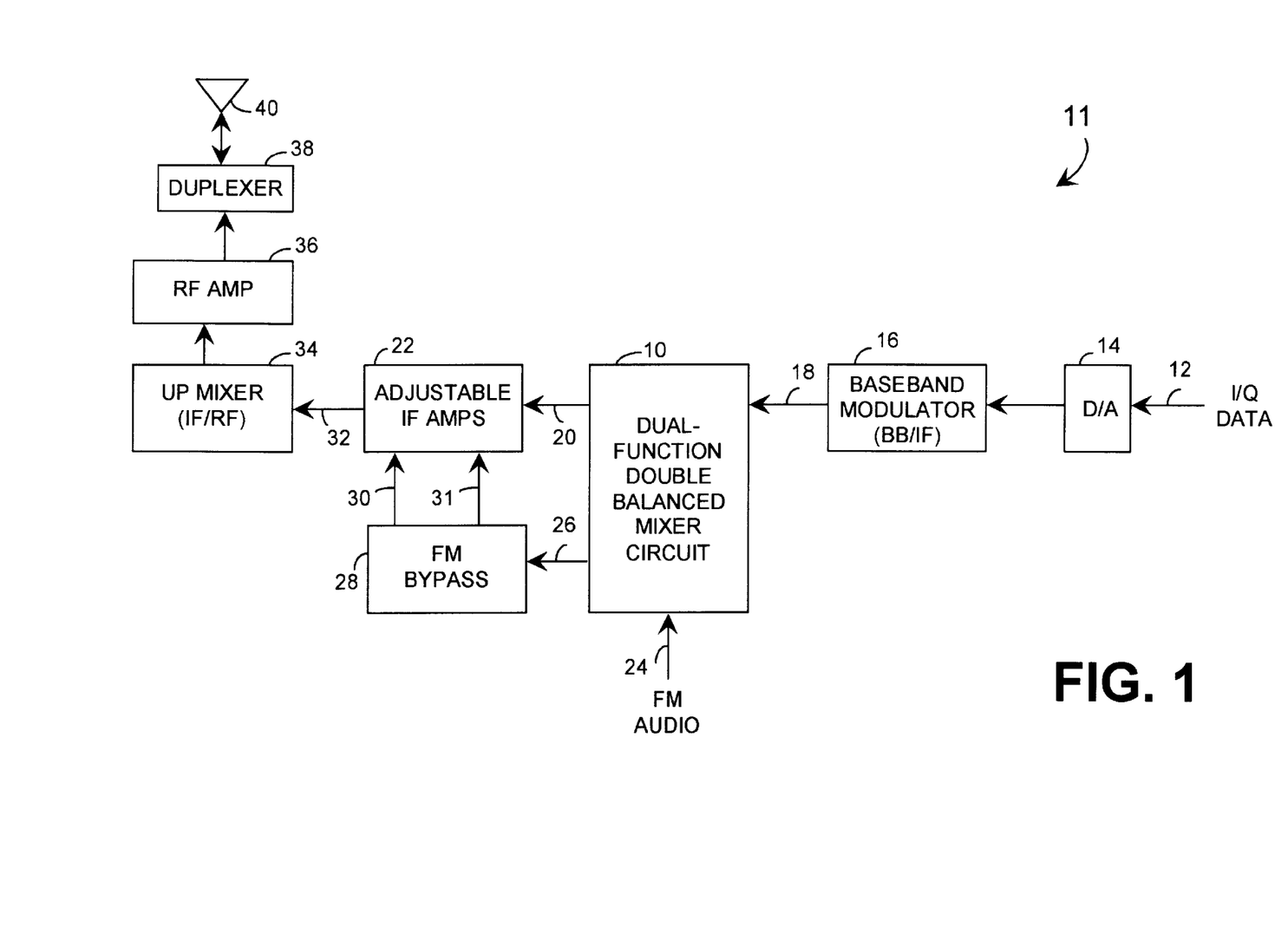
FIG. 1 is a block diagram representation of signal paths in a transmit portion of a CDMA/FM dual-mode cellular telephone, including a dual-function double balanced mixer circuit in accordance with one preferred embodiment of the present invention.

Referring now in greater detail to the drawings, in which like numerals represent like components throughout the several views, FIGS. 1–6 illustrate one preferred embodiment of the present invention. FIG. 1 is a signal path block diagram representation of a dual-function double balanced mixer circuit 10 located in the middle of a transmit portion 11 of a dual-mode CDMA/FM cellular telephone. In accordance with the preferred embodiments of the present invention, the CDMA/FM cellular telephone, of which the transmit portion 11 forms one part, includes a host of other components which, although not shown in any of the FIGS. 1–6, would be readily understood regarding the operation of, and the need for, such components.

Digital I/Q data lines 12 are shown connected to a D/A (digital-to-analog) converter 14 followed by a baseband modulator 16. One example of an acceptable prior art integrated circuit containing the D/A converter 14 and the baseband modulator 16, in addition to a variety of other components, is the CDMA Baseband Analog ASIC (application specific integrated circuit) available from Qualcomm, Inc. of San Diego, Calif. A CDMA low IF line 18 carries CDMA signals in analog form at a "low" (relatively) intermediate frequency from the baseband modulator 16 to the dual-function double balanced mixer circuit 10. One example of an acceptable "low" intermediate frequency for the signals on the CDMA low IF line 18 is 4.95 MHz.

As is explained in greater detail below, the dual-function double balanced mixer circuit 10 selectively functions in either a CDMA mode of operation or an FM mode of operation. In the CDMA mode, the dual-function double balanced mixer circuit 10 receives CDMA low IF signals through the CDMA low IF line 18, converts the signals into CDMA "high" IF signals, and outputs the signals over a CDMA high IF line 20 to an adjustable IF amplifier circuit 22. One example of an acceptable "high" intermediate frequency for the signals on the CDMA high IF line 20 is 114.99 MHz. In the FM mode of operation, ordinary audio signals are received over the FM audio line 24, modulated into FM IF signals, and output over a modulated FM line 26 to an FM bypass circuit 28. While audio signals normally range between 300 Hz to 10 KHz, one example of an acceptable frequency for signals on the modulated FM line 26 is 128.16 MHz. During the FM mode of operation, the FM bypass circuit 28 outputs the FM IF signals over an FM bypass line 30 to the adjustable IF amplifier circuit 22, along with an FM gain control line 31. Subsequent to the adjustable IF amplifier circuit 22, either CDMA or FM signals travel through an amplified IF line 32 to be processed identically through a conventional up mixer circuit 34, RF amplifier circuit 36, duplexer 38, and antenna 40.

Figure 2:
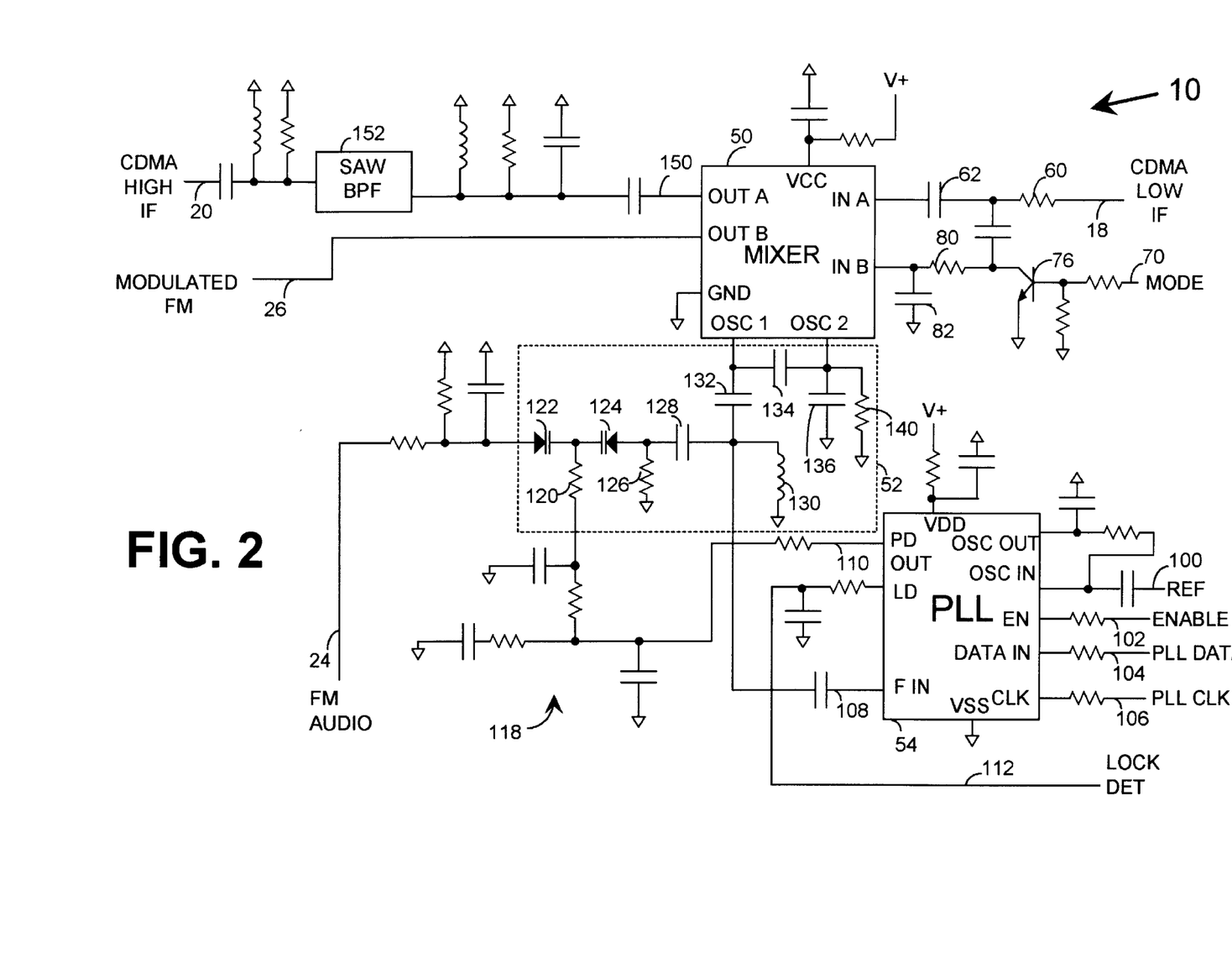
FIG. 2 is a schematic representation of the dual-function double balanced mixer circuit of FIG. 1.

Refer now to FIG. 2, which shows a schematic representation of the dual-function double balanced mixer circuit 10 of FIG. 1. The major components of the dual-function double balanced mixer circuit 10 include a mixer IC (integrated circuit) 50 connected through an external LC tank 52 to a phase locked loop frequency synthesizer IC (PLL) 54. In the CDMA mode of operation, CDMA low IF signals pass over the CDMA low IF line 18, through resistor 60 and capacitor 62 to an "IN A" input on the mixer 50. A mode line 70, under the control of a central microprocessor (not shown), is low (e.g., 0 volts) during the CDMA mode of operation and high (e.g., +5 volts) during the FM mode of operation. As is discussed in more detail below, the transistor 76 functions as a switch to unbalance the mixer 50 by selectively grounding an "IN B" input of the mixer 50 across a resistor 80 during the FM mode of operation.

In addition to the mode line 70, other controls lines connected to the PLL 54 include a reference line 100 extending through an RC (resistor-capacitor) network to an OSC IN input and an OSC OUT output, an enable line 102 resistively coupled to an EN input, a PLL data line 104 resistively coupled to a DATA IN input, a PLL clock line 106 resistively coupled to a CLK input, and a lock detect line 112 RC-coupled to an LD output. One example of an acceptable reference frequency for the reference line 100 is 19.8 MHz provided by a temperature-compensated crystal oscillator (not shown). The PLL 54 is shown connected to the LC tank 52 through an "F IN" input connected to a tank frequency line 108 and a "PD OUT" output connected to a frequency/phase modification line 110. As would be understood by one reasonably skilled in the industry the PLL 54 outputs a DC voltage onto the frequency/phase modification line 110 to cause the LC tank 52 to establish and maintain a particular frequency on the tank frequency line 108. The particular frequency maintained by the LC tank 52 and the PLL 54 is determined by data loaded into the PLL 54 through the PLL data line 104 from the central microprocessor (not shown). Examples of acceptable frequencies maintained on the tank frequency line 108 are 119.94 MHz for the CDMA mode of operation and 128.16 MHz for the FM mode of operation.

After being modified as a result of passing through a conventional filter/noise RC network 118, the DC voltage applied to the frequency/phase modification line 110 by the PLL 54 reaches the LC tank 52. The LC tank 52 includes resistors 120, 126 and 140, capacitors 128, 132, 134, and 136, and inductor 130. After encountering an isolation resistor 120, the DC voltage adjusts the effective capacitance created by varactor diodes 122 and 124. The capacitive and inductive ability of the LC tank 52 cooperates with amplifiers internal to the mixer 50 (FIG. 5) to create and sustain an oscillation which is fed into an "OSC 1" input on the mixer 50, as well as looped back to the PLL 54 through the tank frequency line 108 for continual adjustment to assure consistency of frequency.

In the CDMA mode of operation, no signals appear on the FM audio line 24, signals do appear on the CDMA low IF line 18, and the mode line 70 is low so that the mixer 50 operates in a normal, balanced manner by mixing the signals coming in the IN A input and the OSC 1 input. Accordingly, a signal containing the frequency sum and frequency difference are output through an OUT A, after which the signal is matched to, and filtered by, a SAW BPF (surface acoustic wave band pass filter) circuit 152 which passes the frequency difference onto the CDMA high IF line 20. In accordance with the example frequencies discussed above, the 4.95 MHz CDMA low IF signal is mixed with a 119.94 MHz oscillator frequency on OSC 1 so that a 114.99 Mm signal appears on the CDMA high IF line 20. As is typical with a double balanced mixer, the input frequencies (4.95 MHz and 119.94 MHz) do not appear in the signal coming from the OUT A output.

In the FM mode of operation, no signals appear on the CDMA low IF line 18, signals do appear on the FM audio line 24, and the mode line 70 is high so that the IN B input of the mixer 50 is grounded across resistor 80 to unbalance the mixer 50. As a result, the frequency appearing on the OSC 1 input is simply passed through to both the OUT B and OUT A outputs, of which only the OUT B output is used in the FM mode of operation. By directing audio signals into the LC tank 52 as shown, the audio signal modulates the oscillating frequency. In the FM mode, the oscillating frequency determined by the PLL 54 is different from that of the CDMA mode. One example of an acceptable FM oscillating frequency is 128.16 MHz, so that the modulated FM signal appearing on the modulated FM line 26 is also centered on 128.16 MHz, with a 15 KHz shift around that frequency as a result of the audio input.

Figure 3:
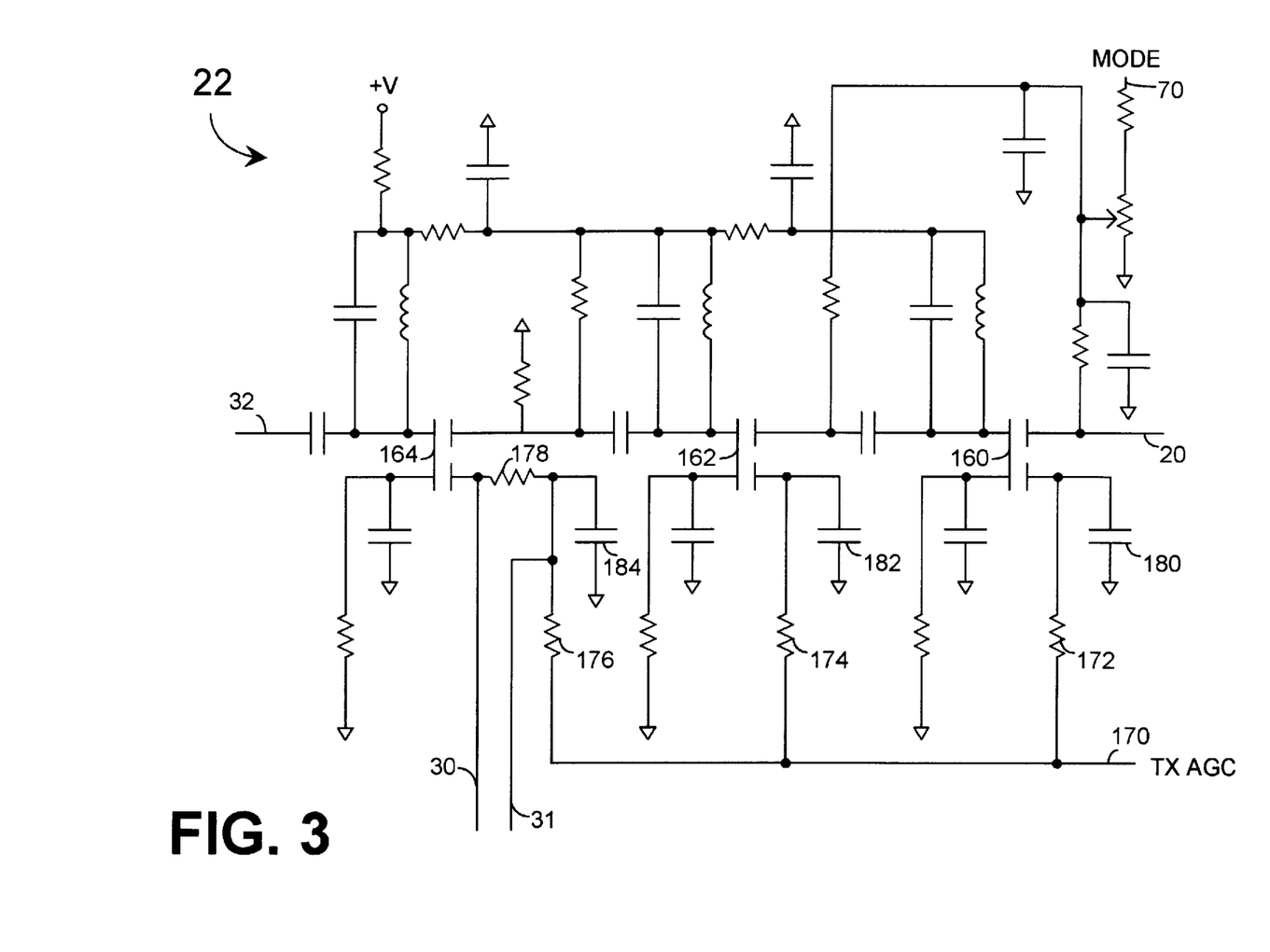
FIG. 3 is a schematic representation of the adjustable IF amplifiers circuit of FIG. 1.
Figure 4:
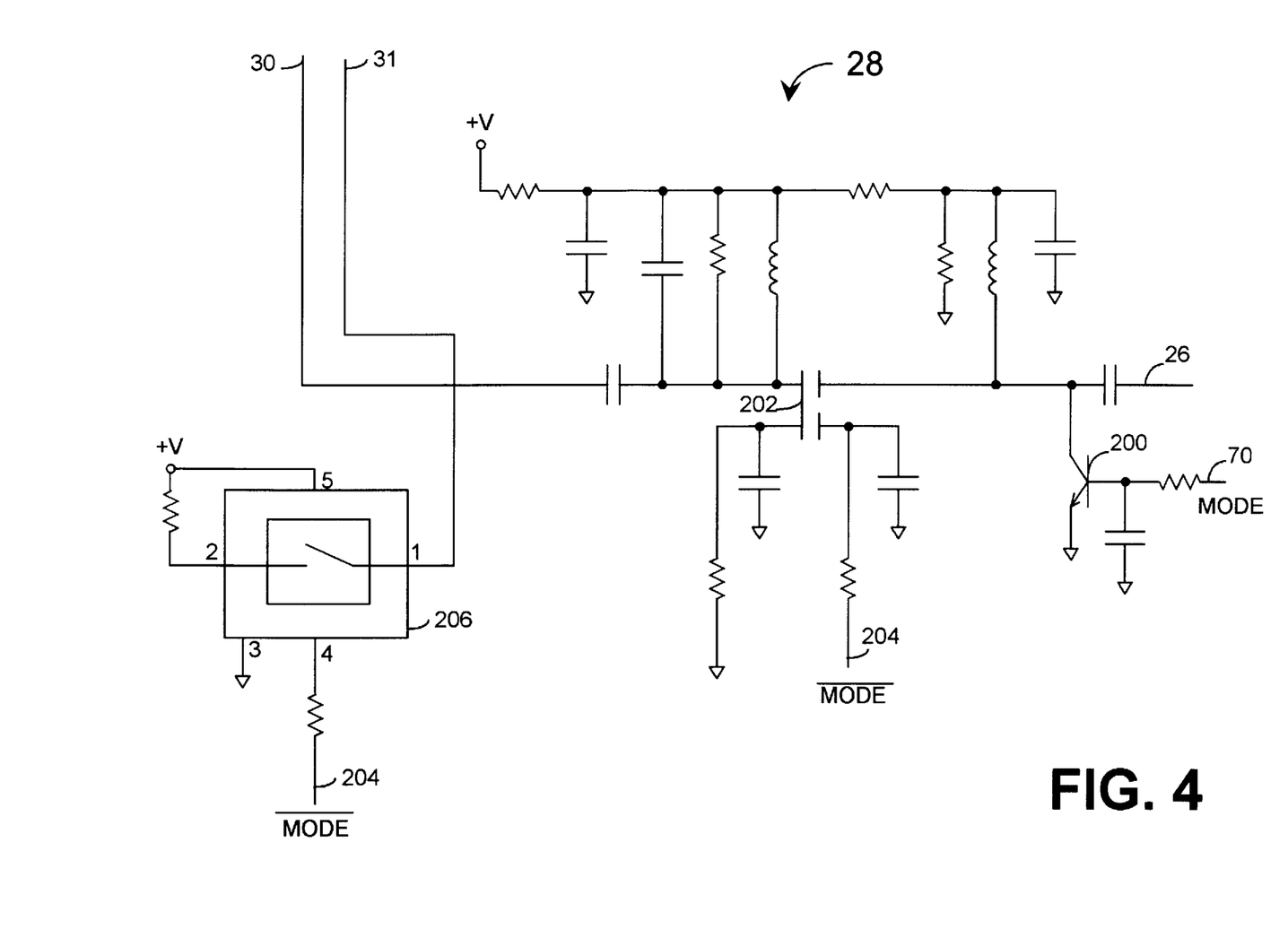
FIG. 4 is a schematic representation of the FM bypass circuit of FIG. 1

Refer now to the FIG. 3, which shows a schematic representation of the adjustable IF amplifier circuit 22 of FIG. 1. The CDMA high IF line 20 is shown connected to the first of a series of dual-gate FETs 160, 162, 164 (field-effect transistors) which amplify signals on that line, in the CDMA mode, according to levels on the TX AGC (transmit automatic gain control) line 170, as determined by a separate automatic gain control circuit (not shown). During the FM mode of operation, the mode line 70 disables the CDMA high IF line 20 so that the FET 164 amplifies onto the amplified IF line 32 signals received through the FM bypass line 30 at a gain determined by the FM gain control line 31. Referring also to FIG. 4, the FM bypass circuit 28 essentially provides a mechanism for switching the FM bypass line 30 off during the CDMA mode through operation of transistor 200 and FET 202, and setting the gain level through the FM gain control line 31 through operation of the switch 206.

Figure 5:
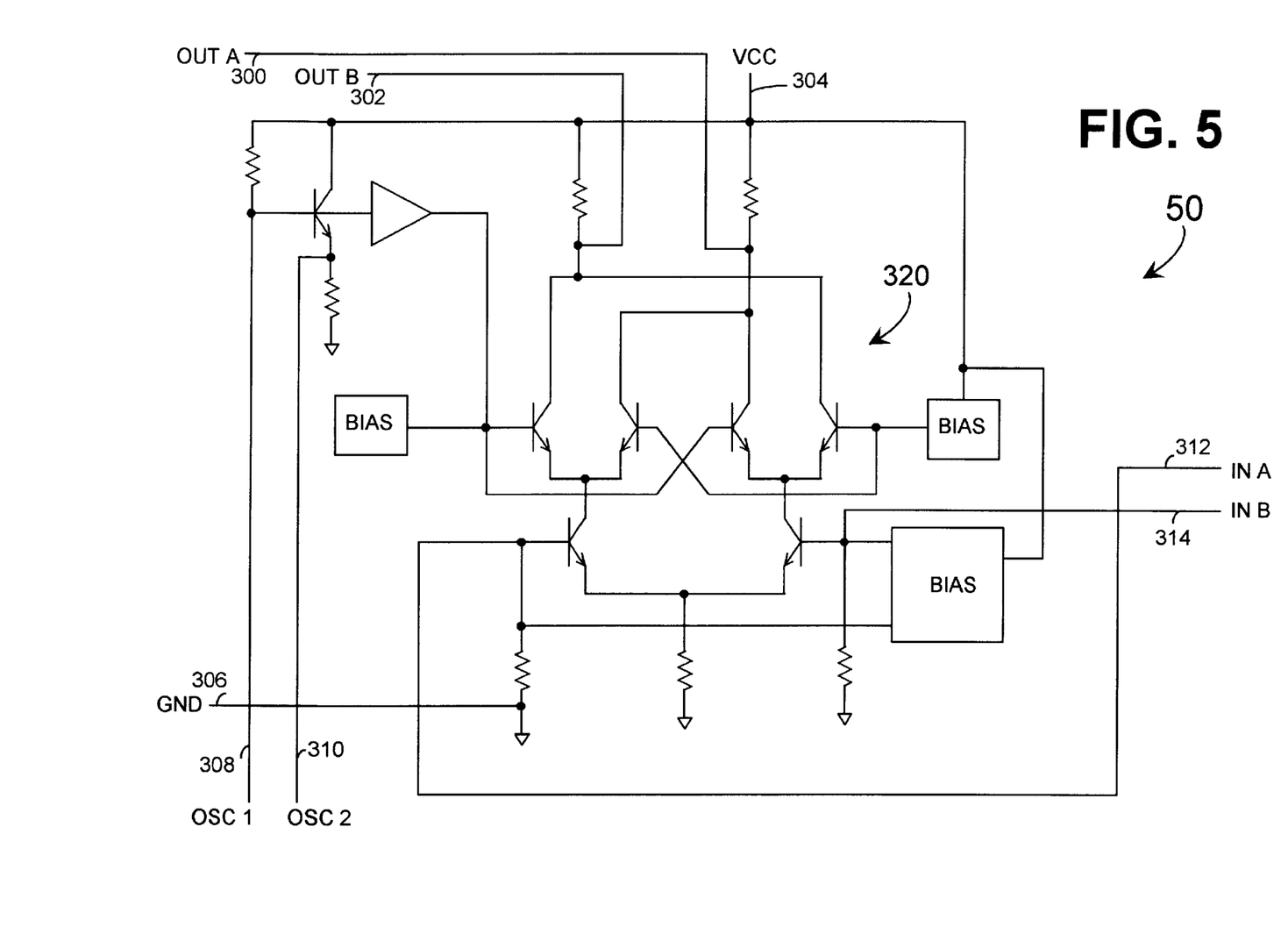
FIG. 5 is a schematic representation of the mixer of FIG. 2.
Figure 6:
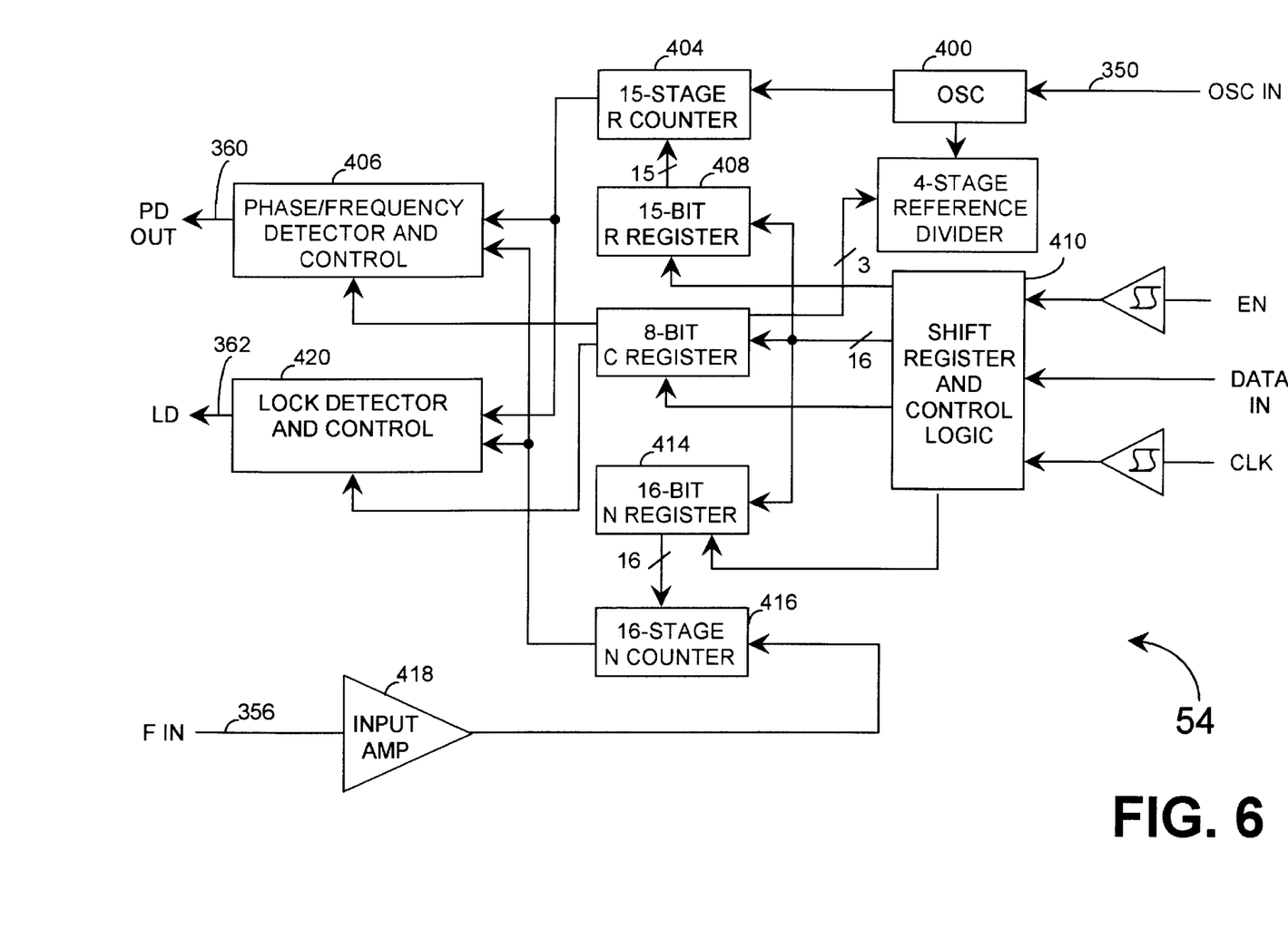
FIG. 6 is a block diagram representation of the PLL of FIG. 2.

FIGS. 5 and 6 show more detailed views of the mixer 50 and PLL 54 of FIG. 2, respectively. To those skilled in the art, it is apparent how grounding the IN B input will unbalance the Gilbert cell multiplier configuration of the mixer 50 and change the internal balance between the internal transistor pairs so that the frequency of the signal on the OSC I input appears at the OUT B and OUT A outputs. One example of an acceptable mixer 50 is the prior art Double-balanced mixer and oscillator SA602A from Signetics Corporation of Sunnyvale, Calif. With reference to FIG. 6, the PLL 54 receives a reference signal through the OSC IN input onto path 350 which feeds the signal into an oscillator 400 which delivers the signal to a 15-stage counter 404. The counter 404, as determine by a 15-bit register 408, divides the reference frequency down to an internal frequency, such as 60 KHz. Similarly, the frequency entering the F IN input, after traveling through a path 356 and an input amplifier 418, is divided down to the same internal frequency by a 16-stage counter 416 as determined by a 16-bit register 414. A shift register and control logic portion 410 passes the appropriate values into the registers 408, 414 to equate the frequencies which exit the counters 404, 416 and enter a phase/frequency detector and control portion 406 and a lock detector and control portion 420. The phase/frequency detector and control portion 406 compares the two frequencies and outputs onto a path 360, which leads to the PD OUT output, a signal which is either low or high until the frequencies are similar, and then adjusts upward or downward to effect a phase adjustment, until settling at a point where the frequencies and phases match. At that point, the lock detector and control portion 420 outputs a signal on path 362 to the LD output to indicate that the frequency/phase locked condition to the central microprocessor (not shown). One example of an acceptable PLL 54 is the prior art MC145170 from Motorola, Inc. of Schaumburg, Ill.

The present invention further includes a second preferred embodiment which is identical in structure and operation to the first preferred embodiment except for the following differences. The main differences are that, with reference to FIGS. 1–3, both CDMA and FM IF signals are (during separate modes) directed through the OUT A output of the mixer 50, and the FM bypass circuit 28 is omitted. Furthermore, the frequency of the CDMA mode oscillation is altered to result in matching frequencies on the CDMA high IF line 20. As an acceptable example, according to the second preferred embodiment, the oscillator frequency at the OSC 1 input to the mixer 50 would be the same 128.16 MHz during the FM mode, but would be 133.11 MHz for the CDMA mode so that the resulting frequency on the CDMA high IF line 20 is 128.16 MHz for both FM and CDMA modes. Clearly, the saw filter 152 would also change to pass that particular frequency. As discussed above, data loaded into the PLL tunes the frequency at the OSC 1 input of the mixer 50. In the adjustable IF amplifier circuit 22 (FIG. 3), the circuit extending from the mode line 70 is deleted along with the FM bypass line 30, FM gain control line 31, and resistor 178. In addition, the resistor 176 and capacitor 184 are appropriately sized in accordance with similarly-placed resistors 174, 172 and capacitors 182, 180.

While the embodiments of the present invention which have been disclosed herein are the preferred forms, other embodiments of the present invention will suggest themselves to persons skilled in the art in view of this disclosure. Therefore, it will be understood that variations and modifications can be effected within the spirit and scope of the invention and that the scope of the present invention should only be limited by the claims below.

We claim:

1. A modulating double balanced mixer circuit comprising:

a double balanced mixer including a first signal input, a second signal input, a pair of oscillator inputs, and an output;

a variable external inductor-capacitor circuit including an output connected to said pair of oscillator inputs and further including a frequency control input and a modulation input; and a grounding circuit connected to said second signal input of said double balanced mixer.

2. The circuit of claim 1, wherein said variable external inductor-capacitor circuit includes a phase lock loop circuit and a variable tank circuit responsive to said phase lock loop circuit.

3. The circuit of claim 2, wherein said variable tank circuit includes at least one voltage-controlled diode.

4. The circuit of claim 1, wherein said variable external inductor-capacitor circuit includes means for modulating a first frequency with signals from said modulation input.

5. The circuit of claim 1, wherein said grounding circuit includes means for unbalancing said double balanced mixer.

6. A modulating double balanced mixer circuit comprising:

a double balanced mixer including
      a first signal input and a second signal input,
      at least one signal output,
      at least one oscillator input,
      an internal oscillation amplifier, and
      means for mixing signals from said first signal input and said oscillator input during a balanced operation mode to output on said signal output a signal including a frequency sum signal and a frequency difference signal of the signals from said first signal input and said oscillator input and, alternately, for passing signals from said oscillator input through to said signal output during an unbalanced operation mode responsive to said second signal input being grounded;

a selective grounding network coupled to said second signal input for grounding said second signal input during the unbalanced operation mode to unbalance said double balanced mixer;

an inductor-capacitor tank including
   a phase lock loop control input,
   an audio signal input,
   an output coupled to said oscillator input of said double balanced mixer,
   means for cooperating with said internal oscillation amplifier through said oscillator input to create and sustain an oscillation signal, and
   means for modulating the oscillation signal with an audio signal received through said audio signal input; and a phase lock loop frequency synthesizer coupled to said inductor-capacitor tank for controlling a frequency of the oscillation signal, said phase lock loop frequency synthesizer including
   a phase detector output coupled to said phase lock loop control input of said inductor-capacitor tank, and
   a loop input coupled to said output of said inductor-capacitor tank.

7. The circuit of claim 6, wherein an intermediate frequency signal representation of a digital signal is input to said first signal input.

8. The circuit of claim 6, wherein said inductor-capacitor tank includes
   two varacter diodes, and
   a control input coupled to a point interposed between said varacter diodes.

9. The circuit of claim 6, wherein the frequency of the oscillation signal in the balanced operation mode is different from the frequency of the oscillation signal in the unbalanced operation mode.

10. The circuit of claim 6, wherein the balanced operation mode and the unbalanced operation mode are both transmit operation modes.

11. The circuit of claim 6, further comprising a mode select circuit including
   a mode select input coupled to said selective grounding network,
   means for selecting the balanced operation mode, and
   means for selecting the unbalanced operation mode.

12. The circuit of claim 6, wherein said signal output defines a first signal output, and wherein said double balanced mixer further includes
   a second signal output, and
   means for passing signals from said oscillator input through to said second signal output during the unbalanced operation mode.

13. The circuit of claim 12, further comprising a bypass circuit coupled to said second signal output, said bypass circuit including
   means for passing, during the unbalanced operation mode, a signal from said second signal output through to a bypass circuit output coupled to an adjustable amplifier circuit coupled to said first signal output, and
   means for setting, during the unbalanced operation mode, a gain level for adjusting an amplification in said adjustable amplifier circuit.

14. A mixer circuit comprising:
   a mixer including
      a signal input,
      a signal output,
      an oscillator input, and
      means for mixing signals from said signal input and said oscillator input during a balanced operation mode to output on said signal output a signal including a frequency difference signal of the signals from said signal input and said oscillator input and, alternately, for passing signals from said oscillator input through to said signal output during an unbalanced operation mode; and
   means coupled to said oscillator input of said mixer for generating and supplying to said oscillator input a controlled oscillation signal.

15. The circuit of claim 14, wherein said signal input defines a first signal input, wherein said mixer further includes a second signal input, and wherein said controlled oscillation signal generating means includes:
   a selective grounding network for grounding said second signal input during the unbalanced operation mode to unbalance said mixer;
   an inductor-capacitor tank including
      a phase lock loop control input,
      an audio signal input, and
      an output coupled to said oscillator input of said mixer;
   a phase lock loop frequency synthesizer for controlling a frequency of the controlled oscillation signal, said phase lock loop frequency synthesizer including
      a phase detector output coupled to said phase lock loop control input of said inductor-capacitor tank, and
      a loop input coupled to said output of said inductor-capacitor tank.

16. The circuit of claim 15, wherein said signal output defines a first signal output,
   wherein said mixer further includes
      a second signal output, and
      means for passing signals from said oscillator input through to said second signal output during the unbalanced operation mode; and
   wherein said inductor-capacitor tank includes
      two varacter diodes, and
      a control input coupled to a point interposed between said varacter diodes.

17. The circuit of claim 16, further comprising a bypass circuit coupled to said second signal output, said bypass circuit including:
   means for passing, during the unbalanced operation mode, a signal from said second signal output through to a bypass circuit output coupled to an adjustable amplifier circuit, and
   means for setting, during the unbalanced operation mode, a gain level for adjusting an amplification in said adjustable amplifier circuit.

18. The circuit of claim 14, further comprising a mode select circuit including means for selecting between the balanced operation mode and the unbalanced operation mode.

19. The circuit of claim 14, wherein an intermediate frequency signal representation of a digital signal is input to said signal input.

20. The circuit of claim 14, wherein the controlled oscillation signal defines an unmodulated single frequency oscillation signal during the balanced operation mode and defines a modulated oscillation signal during the unbalanced operation mode, wherein the modulated oscillation signal has a center frequency during the unbalanced operation mode at the oscillation frequency of the unmodulated single frequency oscillation signal during the unbalanced operation mode.

21. The circuit of claim 20, wherein the frequency of the controlled oscillation signal in the balanced operation mode is different from the center frequency of the controlled oscillation signal in the unbalanced operation mode.

22. The circuit of claim 14, wherein the balanced operation mode and the unbalanced operation mode are both transmit operation modes.

23. A mixing circuit for operating in a first mode and a second mode, said mixing circuit comprising:
   means for generating a first mode oscillating signal during the first mode and a second mode oscillating signal during the second mode, said generating means including means for adjusting a frequency of the first mode oscillating signal and a center frequency of the second mode oscillating signal; and
   means for mixing, in the first mode, the first mode oscillating signal with an input signal to produce a mixed output signal including a frequency sum signal and a frequency difference signal of the first mode oscillating signal and the input signal and for passing, in the second mode, the second mode oscillating signal through as an output signal.

24. The circuit of claim 23, wherein said generating means includes means for creating and sustaining an adjustable oscillation with a variable inductor-capacitor tank interacting with an amplifier.

25. The circuit of claim 23, wherein said generating means includes a phase lock loop.

26. The circuit of claim 23, wherein the frequency of the first mode oscillating signal is different from the center frequency of the second mode oscillating signal.

27. The circuit of claim 23, wherein the frequency of the frequency difference signal is equal to the center frequency of the second mode oscillating signal.

28. The circuit of claim 23, wherein the frequency of the frequency difference signal is different from the center frequency of the second mode oscillating signal.

29. The circuit of claim 23, wherein said mixing and passing means includes means for converting low intermediate frequency signals to high intermediate frequency signals.

30. The circuit of claim 23, wherein the second mode oscillating signal defines a modulated audio signal.

31. The circuit of claim 23, wherein the input signal is an intermediate frequency analog representation of a digital signal.

32. The circuit of claim 23, wherein the first and second modes are transmission modes of operation.

33. The circuit of claim 23, further comprising means for unbalancing said mixer circuit, during the second mode, through selective grounding.

34. The circuit of claim 23, further comprising means for selecting between the first mode and the second mode, wherein the first mode defines a balanced mixing mode, and the second mode defines an unbalanced passing mode.

35. A mixing circuit for operating in a first mode and a second mode, said mixing circuit comprising:
   means for generating a first mode oscillating signal during the first mode and a second mode oscillating signal during the second mode;
   means for mixing, in the first mode, the first mode oscillating signal with an input signal to produce a mixed output signal and for passing, in the second mode, the second mode oscillating signal through as an output signal;
   means for adjustably amplifying the mixed output signal during the first mode and the output signal during the second mode; and
   a bypass circuit with a bypass output and a gain control output coupled to said adjustably amplifying means including
      means for switching off said bypass output, during the first mode, wherein said bypass output carries no signal,
      means for setting, during the second mode, a gain level of said adjustably amplifying means by generating a gain control signal on said gain control output, and
      means for receiving and passing, during the second mode, the output signal through to said bypass output.

36. A method of operating a double balanced mixer circuit in two alternate modes, said method comprising steps of:
   mixing a first input signal with a generated oscillation signal to produce a mixed output signal during a balanced mixing mode, and
   modulating the generated oscillation signal with a second input signal to produce a modulated oscillation output signal during an unbalanced passing mode,
   wherein the mixed output signal contains a frequency sum signal and a frequency difference signal of the first input signal and the generated oscillation signal during the balanced mixing mode, and
   wherein the modulated oscillation output signal has a frequency centered on the frequency of the generated oscillation signal during the unbalanced passing mode.

37. The method of claim 36, further comprising a step of grounding a double balanced mixer signal input through a selective grounding network during the unbalanced passing mode.

38. The method of claim 36, further comprising steps of, before the mixing step,
   creating and sustaining the generated oscillation signal, and
   controlling the frequency of the generated oscillation signal.

39. A method of operating a double balanced mixer circuit in two alternate modes, said method comprising steps of:
   creating and sustaining a generated oscillation signal,
   controlling the frequency of the generated oscillation signal,
   mixing a first input signal with the generated oscillation signal to produce a mixed output signal during a balanced mixing mode, and
   modulating the generated oscillation signal with a second input signal to produce a modulated oscillation output signal during an unbalanced passing mode,
   wherein the generated oscillation signal is created and sustained with an external variable inductor-capacitor tank circuit, responsive to a phase lock loop frequency synthesizer, interacting with an amplifier.

40. The method of claim 36, wherein the frequency of the generated oscillation signal during the balanced mixing mode is the same as the frequency of the generated oscillation signal during the unbalanced passing mode.

41. The method of claim 36,
   wherein the first input signal is an intermediate frequency analog representation of a digital signal, and
   wherein the modulating step includes modulating the generated oscillation signal with an analog audio signal.

* * * * *